United States Patent [19]

Mosley et al.

[11] 4,224,575
[45] Sep. 23, 1980

[54] PHASE/FREQUENCY CONTROLLED PHASE SHIFT KEYED SIGNAL CARRIER RECONSTRUCTION CIRCUIT

[75] Inventors: William H. Mosley; Lex A. Scott, both of St. Petersburg; Robert S. Gordy, Largo, all of Fla.

[73] Assignee: E-Systems, Inc., Dallas, Tex.

[21] Appl. No.: 964,466

[22] Filed: Nov. 29, 1978

[51] Int. Cl.$^3$ ............................ H03D 3/18; H03L 7/08
[52] U.S. Cl. ...................................... 329/50; 329/122; 329/124; 328/151; 331/23; 375/83
[58] Field of Search ......................... 329/50, 122, 124; 331/18, 23; 325/320, 346, 349; 328/151, 155, 165, 166, 167

[56] References Cited

U.S. PATENT DOCUMENTS

| | | | |
|---|---|---|---|
| 3,838,350 | 9/1974 | Ewanus et al. | 329/122 X |
| 3,953,745 | 4/1976 | Bailey | 307/221 C |
| 4,079,329 | 3/1978 | England et al. | 329/122 X |

Primary Examiner—Siegfried H. Grimm
Assistant Examiner—Edward P. Westin
Attorney, Agent, or Firm—Albert M. Crowder, Jr.; Robert V. Wilder

[57] ABSTRACT

A biphase shift keyed modulated carrier is input to an analog delay line having a plurality of sampling taps time spaced along the line. The modulated input carrier is sampled at a rate four times the carrier frequency to produce amplitude samples of the input. The taps of the delay line are divided into two groups comprising alternate tap sets and the amplitude samples of each group are summed for decoding the I and Q channels of a modulated carrier. The summed signal of each of the channels is input to an individual sample and hold circuit which aliases the carrier frequency to baseband. The output of the first sample and hold circuit of each channel is provided to a second sample and hold circuit for the respective channels. The second sample and hold circuit of each channel is clocked at a data rate derived from a bit timing loop. An estimation of the data is produced by each of the second sample and hold circuits with the data produced by the second sample and hold circuit of one channel providing a recovered carrier signal output. Further, the data produced by each of the second sample and hold circuits, after inversion in one line by means of an inverting amplifier, is input to a phase comparator. The output of the phase comparator is filtered and used to drive a voltage controlled oscillator that generates the clock pulses to operate the first sample and hold circuits and also to clock the delay line.

19 Claims, 5 Drawing Figures

PHASE/FREQUENCY CONTROLLED PHASE SHIFT KEYED SIGNAL CARRIER RECONSTRUCTION CIRCUIT

This invention relates to a demodulator for a phase modulated carrier wave communication system and more particularly relates to a phase locked carrier recovery loop having discriminator characteristics.

Many information encoding schemes are known which are capable of conveying information of a binary nature between various types of information utilization devices. Among these are the group known as phase modulated carrier systems which are particularly suitable for transmitting digital information. Typical of such phase modulated carrier systems is one that uses phase shift keying (PSK) where the phase of the carrier is discretely shifted to one of n phases between 0° and 360° for information transmittal. Phase shift keying is typically either a biphase modulation system (BPSK) or a quadraphase modulation system (QPSK). Such a modulation scheme generally produces a transmitted signal in which the carrier frequency is suppressed and all the energy appears in the modulation sidebands.

To demodulate the modulated suppressed carrier signal it is necessary at the receiving end to provide coherent demodulation or phase detection. This requires the reconstruction of the carrier which had been suppressed at the transmitter, which reconstruction must be frequency and phase controlled to permit coherent detection.

Although there are well known circuits for performing the coherent detection, such as the Costas and Squaring Loop, a drawback of conventional phase correction circuits is the requirement of using matched filters in the I and Q channels. Filters are also required in conventional loops to eliminate mixing products of signals from each of the quadrature displaced channels. A carrier recovery loop in accordance with the present invention uses sample and hold circuits to alias a signal to the baseband frequency thereby eliminating the need of filters in the quadrature displaced channels after the sample and hold. This is because the sample and hold process has a zero in the frequency transfer function at the mixing product frequencies. A carrier recovery loop not requiring such filtering has the advantage of being capable of construction in a semiconductor technology such as CMOS on a single chip with large scale integration (LSI).

In accordance with the present invention, an IF input (typically a BPSK modulated carrier) to a carrier recovery loop is applied to a tapped analog delay line which, though not necessarily, is a charged coupled device (CCD). Semiconductor charge transfer devices offer numerous advantages in the construction of delay lines. A primary advantage of CCDs is their inherent simplicity and cost effectiveness. For example, a delay line is substantially defined on a homogenous doped substrate. An input signal is transferred along the delay line by a clock applied to a series of electrodes formed along the substrate and separated therefrom by a thin insulating region. The tapped analog delay line thus takes amplitude samples of the input when clocked and shifts the input samples down a series connection.

In accordance with one embodiment of the present invention, a phase shift keyed carrier recovery loop includes apparatus for taking samples of an input signal at a rate equal to four times the input frequency which generates quadrature displaced first and second channels by virtue of the relationship of the sampling rate to the input signal frequency. Samples from the first channel are combined into a first filtered signal and samples from the second channel are combined into a second filtered signal. The first filtered signal is sampled and stored at selected intervals and the second filtered signal is likewise sampled and stored at the selected intervals with the stored sample developed from one of the channels outputted as a carrier signal recovered from the PSK input signal. A stored sample of the first signal is combined with a stored sample of the second filtered signal to generate a control signal. The control signal establishes the time delayed intervals for taking samples of the input signal and also establishes the selected intervals for sampling and storing the first and second filtered signals.

For a more complete understanding of the invention and its advantages, reference may now be had to the following description taken in conjunction with the accompanying drawings. Referring to the drawings.

Figure 1:
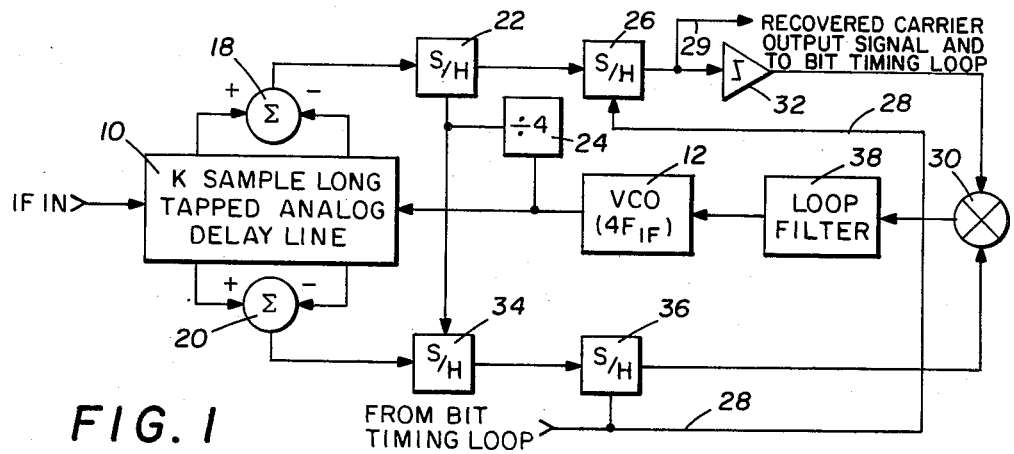
FIG. 1 is a block diagram of a sampling analog biphase shift keyed carrier recovery loop utilizing a tapped analog delay line to produce quadrature displaced signals in first and second channels.

Referring to FIG. 1, a biphase shift keyed modulated carrier IF signal is applied to an input of a tapped analog delay line 10 functioning as a shift register and receiving at a clock terminal a sequence of clock pulses at four times the input signal center frequency from a voltage controlled oscillator 12. Typically, the analog delay line 10 is a charge coupled device and may receive either an analog input signal or a digital input signal, the digital signal after passing to a D/A converter. At each clock pulse applied to the delay line 10 the input signal is shifted one tap further through the delay line and an amplitude sample is taken at each tap for each clock pulse. As an input signal travels down the tapped analog delay line 10, in response to each of the clock pulses, individual amplitude samples are available at the various sample and hold points (taps on the delay line) to be used for recovering the carrier of the input signal for operation of the system as a phase locked loop.

If the sample rate (clock pulse rate from the voltage controlled oscillator 12) of the tapped analog delay line 10 is four times the IF input frequency, adjacent samples along the tapped analog delay line are in quadrature relationship to each other. Also, samples at each of the even taps (for example, TAP2, TAP4, etc.) are 180° out of phase with samples at the adjacent even taps, and samples at each of the odd taps (for example TAP1, TAP3, etc.) are 180° out of phase with samples at each adjacent odd taps.

Figure 2:
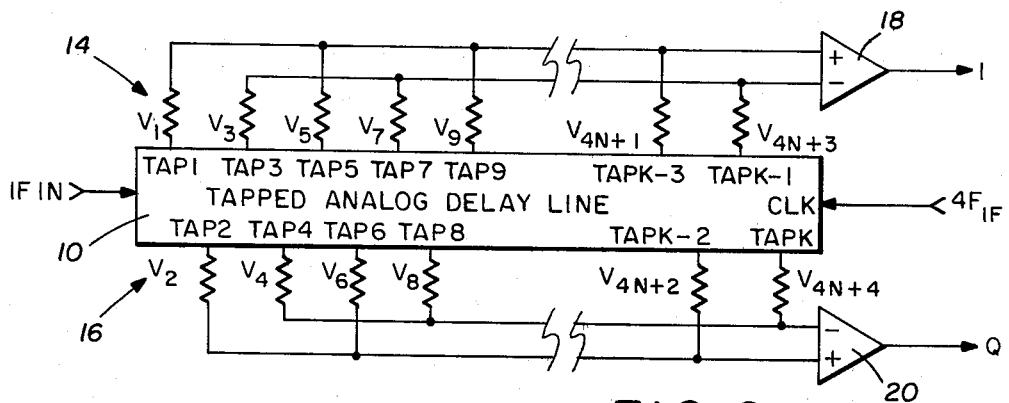
FIG. 2 is a schematic diagram of the tapped analog delay line of FIG. 1 which typically may be a charge coupled device.

Referring to FIG. 2, there is shown schematically the tapped analog delay line 10 with resistor networks 14 and 16 connected to taps time displaced along the delay line. The resistor network 14 connects to the odd numbered taps of the delay line 10 to generate a quadrature component of the input signal applied to inputs of a summing amplifier 18. Similarly, the resistor network 16 is connected to the even numbered taps of the delay line 10 to connect amplitude samples of the input signal to a summing amplifier 20. The amplitude samples applied to the summing amplifier 20 comprise the second quadrature component of the input signal. The interconnection of the resistor networks 14 and 16 to the summing amplifiers 18 and 20, respectively, perform matched filtering of the quadrature components (I and Q) channels of the input signals. These matched filters are mathematically described in the time domain as follows:

$$I(nT) = \sum_{i=0}^{\frac{K}{4}-1} (V_{4i+1}^{nT} - V_{4i+3}^{nT})$$

I Channel $$Q(nT) = \sum_{i=0}^{\frac{K}{4}-1} (V_{4i+2}^{nT} - V_{4i+4}^{nT})$$

Q Channel where
T = 1/SAMPLE RATE
n = 0, 1, 2, 3.

With reference to the I channel, all samples of one phase are connected to the noninverting terminal of the amplifier 18 and all samples 180° displaced are connected to the inverting terminal of the amplifier. By differencing the sum of the odd numbered taps which are 180° out of phase with the other odd numbered taps a matched filter is implemented having a (sine X)/X frequency response centered at the frequency of the IF input and the frequency response has first nulls at frequency locations plus and minus $F_{IF}/K/4$ which is the data rate. A similar matched filter is implemented by interconnecting all in-phase even numbered taps of group one to the noninverting terminal of the summing amplifier 20 and connecting all even numbered taps 180° out of phase with group one to the inverting terminal of the amplifier as a second group. Again, a differencing of these signals takes place in the amplifier 20 and matched filtering is achieved.

Thus, since there are two sets of taps (the odd numbered taps connected to the resistor network 14 and the even numbered taps connected to the resistor network 16), and the two sets are in a quadrature relationship the I and Q channel signals are generated at the outputs of the summing amplifiers 18 and 20, respectively, and the signals have been matched filtered by operation of summing of the taps of the tapped analog delay line.

Returning to FIG. 1, connected to the output of the summing amplifier 18 in the I channel is a sample and hold circuit 22 that receives sampling time interval pulses from a divide-by-four divider 24. The input to the divide-by-four divider 24 is the clock pulse output of the voltage controlled oscillator 12. Thus, the sample rate of the sample and hold circuit 22 is one-fourth the clock pulse input to the analog delay line 10. If the output of the voltage controlled oscillator 12 has a pulse rate of four times the input frequency, the sample and hold circuit 22 is sampled at the input frequency rate. This produces a (sine X)/X frequency response from the sample and hold circuit 22 with nulls at all multiples of the sample rate and eliminates the need for filtering spurious signals generated by sampling the IF inputs.

Connected to the output of the sample and hold circuit 22 is a sample and hold circuit 26 that samples the output of the first sample and hold circuit at the data rate with timing pulses connected thereto by means of a line 28. Timing pulses applied to the line 28 are derived from a bit timing loop to provide sampling of the output circuit 26 at the peak values of the signal and thereby provide optimum estimation of the data in the I channel to the bit timing loop and as an output signal providing the recovered carrier signal on the output line 29. Also connected to the sample and hold circuit 26 is a comparator amplifier 30 through a signal shaping amplifier 32. By operation of the inverter amplifier 32, one input to the comparator amplifier 30 varies between a +1 logic level and a −1 logic level.

Referring to the Q channel, the output of the summing amplifier 20 is input to a sample and hold circuit 34 that also receives timing interval pulses from the output of the divide-by-four divider 24. Thus, the sample and hold circuit 34 functions similarly to the sample and hold circuit 22 as connected in the I channel. An output of the sample and hold circuit 34 in the Q channel is connected to a sample and hold circuit 36 that is similar to the sample and hold circuit 26 and is sampled at the data rate by timing pulses from the bit timing loop connected to the line 28. Connected to the output of the sample and hold circuit 36 is a second input of the comparator amplifier 30.

As implemented, the comparator amplifier 30 multiplies the data in the Q channel with the output of the signal shaping amplifier 32 to generate a loop phase error signal which is applied to a loop filter 38. After filtering, the output of the loop filter 38 is the control signal applied to the input of the voltage controlled oscillator 12 to generate a frequency for controlling the sample rate of the tapped analog delay line and the sampling interval of the sample and hold circuits 22 and 34.

Figure 3:
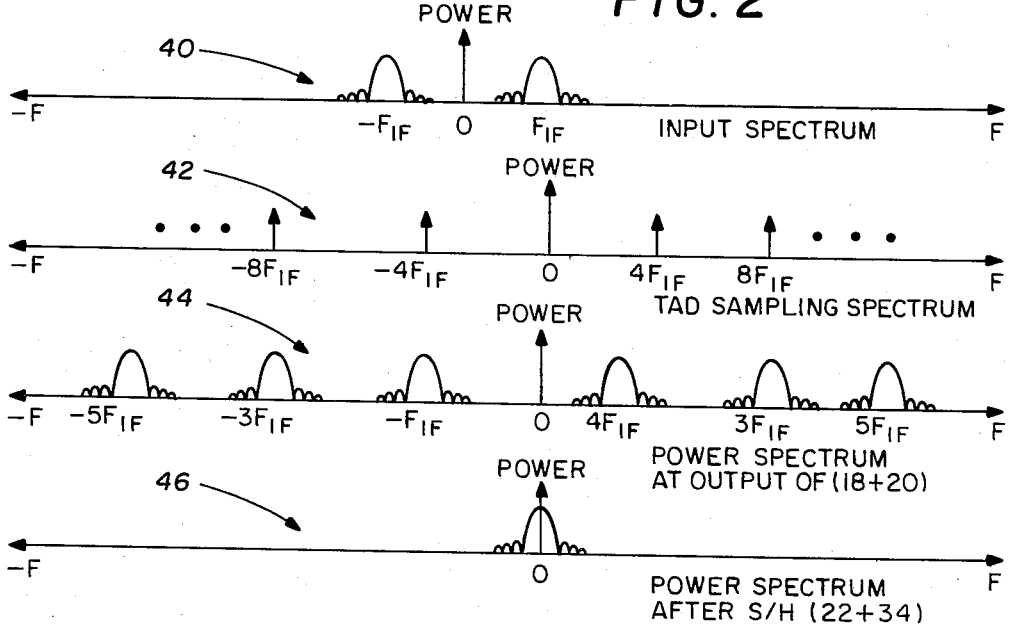
FIG. 3 is a sequence of power spectrum diagrams showing signal processing through the carrier recovery loop of FIG. 1.

In operation of the circuit of FIG. 1 and with reference to FIG. 3, an IF input signal (biphase shift keyed modulated carrier) as illustrated by the waveform 40 is applied to the input of the tapped analog delay line 10. The IF input signal is clocked through the delay line 10 by the sequence of clock pulses from the voltage controlled oscillator 12. Amplitude samples of the input are taken at each of the taps along the delay line 10 for each clock pulse from the voltage controlled oscillator 12. Thus, for each clock pulse a sample travels one tap down the tapped delay line 10 and for a series of clock pulses is sequentially available at the various sample and hold points (line taps).

The tapped analog delay line sampling frequency spectrum is shown by waveform 42 which corresponds to each clock pulse appearing at a sampling rate that is equal to four times the frequency of the input applied to the delay line. As explained, the two sets of taps (the odd numbered taps and even numbered taps) are 90° out of phase and in a quadrature relationship. This generates signals in the I channel with a frequency spectrum as indicated by the waveforms 44 and 46 with the signal filtering achieved in the summing of the taps of analog delay line. A similar signal is generated and filtered in the Q channel.

Signals at the odd numbered taps along the delay line 10 are summed in the amplifier 18 and aliased to the baseband frequency in the sample and hold circuit 22. The sample and hold circuit 22 is clocked at the frequency of the input signal by the output of the divideby-four divider 24. The second sample and hold circuit in the I channel, that is, the sample and hold circuit 26, samples at the data rate with timing derived from the bit timing loop in order to sample the output of the analog delay line 10 to provide optimal estimations of the data in the I channel. These samples are supplied as the recovered carrier output signal and as an input to the bit timing loop over the output line 29 and also input to the comparator amplifier 30.

A similar operation takes place in the Q channel with the sample and hold circuit 34 connected to the output of the summing amplifier 20, aliasing the IF input signal to the baseband frequency. The sample and hold 34 is timed at a pulse rate equal to the input frequency by the output of the divide-by-four divider 24. The second sample and hold circuit, that is, the sample and hold circuit 36, in the Q channel samples at the data rate with timing derived from the bit timing loop, to again sample the output of the analog delay line 10 at the peak value to provide optimal estimation of data in the Q channel to the second input of the comparator amplifier 30.

An output signal from the comparator amplifier 30, after passing through the loop filter 38, provides a control signal to the voltage controlled oscillator 12 to vary the output frequency thereof and therefore the clock rate of the loop. The loop operates in a manner to provide discrimator characteristics because of the frequency response characteristics of the matched filters and their location in the circuit giving it the ability to lock onto input frequency signals having a large frequency offset relative to the loop bandwidth.

Because a quadrature relationship is generated at the output of the two matched filters, that is, the outputs of the summing amplifiers 18 and 20 in the I and Q channels respectively, two adjacent samples of the input will only be orthogonal when the input frequency is one-fourth of the sampling rate, that is, one-fourth the output of the voltage controlled oscillator 12. If the input frequency applied to the delay line 10 is not equal to one-fourth the output of the voltage controlled oscillator 12, then the signals in the I and Q channels are not orthogonal and the output of the comparator amplifier 30 generates a control signal to vary the output frequency of the voltage controlled oscillator 12 to reduce the frequency difference.

Figure 4:
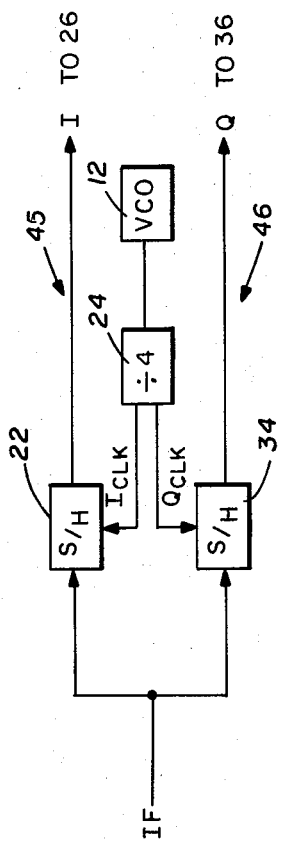
FIG. 4 is a block diagram of an alternate embodiment of the phase memory loop.

An alternate embodiment of the loop is shown in FIG. 4 and is now used to explain the frequency discrimination capability.

Figure 5:
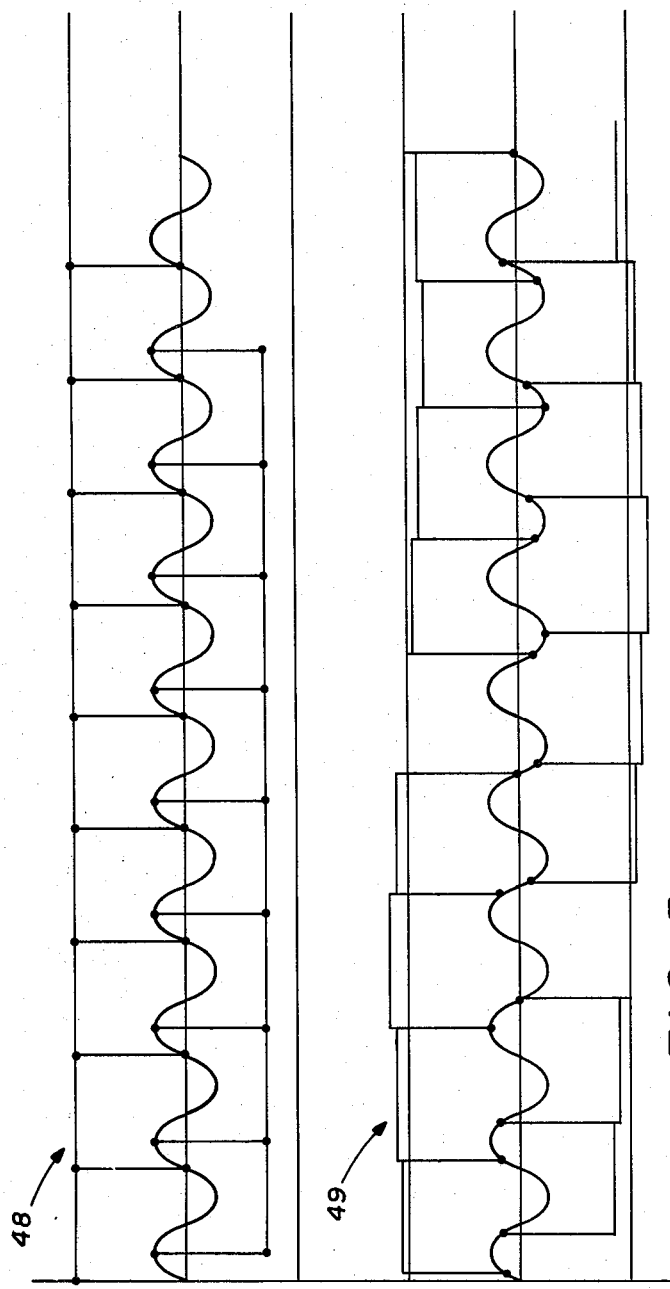
FIG. 5 illustrates waveforms of the two channel signals with reference to an intermediate frequency (IF) input signal.

Referring to FIG. 4, the I and Q signals are only orthogonal when the loop is phase locked to the incoming signal. This is because the I and Q sampling pulses are at intervals of one-fourth of an IF sine wave cycle in the locked condition as shown by the waveform of FIG. 5. If the incoming IF signal is not one-fourth of the VCO frequency and I and Q sampling pulses occur at time intervals different from one-fourth of the IF sine wave cycle as shown by the waveform 49 of FIG. 5, in the locked condition the I and Q channels are displaced from each other by 90° or one-fourth of the sine wave cycle and in the unlocked condition the I and Q channels are displaced by more or less than 90° from each other. The multiplication of the I and Q channel signals in the comparator amplifier 30 provide an average output that is proportional to the correlation between the I and Q channels. It is thus possible to see how the frequency discriminator action occurs by noting that the average output of the comparator amplifier 30 can only be zero in the phase locked condition when the I and Q signals are orthogonal. Whenever the loop is not locked the I and Q signals are not orthogonal but are correlated and will produce an average output from the comparator amplifier 30 in the proper polarity to bring the loop into phase lock.

The phase error that results between samples generated in the I and Q channels when the input frequency is not equal to one-fourth the output of the voltage controlled oscillator 12 will operate the comparator amplifier 30 to generate a control signal to reduce the frequency difference. This reduction of the frequency difference between the input signal and one-fourth the output of the voltage controlled oscillator is achieved by varying the output frequency of the voltage controlled oscillator 12. The comparator amplifier 30 correlates the phase error between the I and Q channels to produce a control signal that is proportional to frequency offset in radians per second.

In an alternate embodiment of the carrier recovery loop as shown in FIG. 1 the sample and hold circuits 26 and 36 are not utilized. In this implementation, the output of the sample and hold circuit 22 is directly coupled to the comparator amplifier 30 and the output of the sample and hold circuit 34 is likewise directly connected to the comparator amplifier. The data output is applied to the bit timing loop from the output of the sample and hold circuit 22 which is also applied to the shaping amplifier 32. This alternate embodiment operates in a manner similar to the circuit of FIG. 1 with the tapped analog delay line functioning as matched filters generating quadrature signals in I and Q channels which are phase compared in the comparator multiplier 30. By adjusting the output of the voltage controlled oscillator 12 directly from the outputs of the sample and hold circuits 22 and 34 the loop is adjusted to lock on to the input frequency of the IF signal applied to the analog delay line 10.

While only one embodiment of the invention, together with modifications thereof, has been described in detail herein and shown in the accompanying drawings, it will be evident that various further modifications are possible without departing from the scope of the invention.

What is claimed is:

1. A phase shift keyed carrier recovery loop, comprising in combination:
    means for taking samples of an input signal at timing intervals so as to generate quadrature displaced first and second channels,
    means for combining the samples of one channel into a first filtered signal,
    means for combining the samples of the second channel into a second filtered signal,
    means for sampling and storing the first filtered signal at selected intervals,
    means for sampling and storing the second filtered signal at selected intervals,
    means for combining a stored sample of the first filtered signal with a stored sample of the second filtered signal to generate a control signal,
    means responsive to the control signal to establish the timing intervals of said means for taking samples and for establishing the selected intervals for sampling and storing the first and second filtered signals; and
    means for outputting a stored sample of one of the first and second filtered signals as the recovered carrier signal.

2. A phase shift keyed carrier recovery loop as set forth in claim 1 wherein said means for taking samples includes a tapped delay line.

3. A phase shift keyed carrier recovery loop as set forth in claim 2 wherein the taps along said delay line are positioned to generate quadrature components of the input signal along the first and second channels.

4. A phase shift keyed carrier recovery loop as set forth in claim 2 where the taps along said delay line are positioned such that properly weighted sums of said taps operate as matched filters of the input signal.

5. A phase shift keyed carrier recovery loop as set forth in claim 2 wherein the taps along said delay line are positioned such that adjacent samples are in a quadrature relationship.

6. A phase shift keyed carrier recovery loop as set forth in claim 2 wherein the taps of one channel are phase displaced at even intervals of a waveform of the input signal and the taps of the second channel are phase displaced at odd intervals of the input signal waveform.

7. A phase shift keyed carrier recovery loop as set forth in claim 2 wherein the taps of the first and second channels are phase displaced 90° along the delay line.

8. A phase shift keyed carrier recovery loop, comprising in combination:
   means for taking amplitude samples of an input signal at timing intervals so as to generate quadrature displaced first and second channels,
   means for combining the samples of one channel into a first filtered signal,
   means for combining the samples of the second channel into a second filtered signal,
   means for aliasing the first filtered signal to the baseband frequency of the input signal at selected intervals,
   means for aliasing the second filtered signal to the baseband frequency of the input signal at selected intervals,
   means for combining the aliased first filtered signal with the aliased second filtered signal to generate a control signal,
   means responsive to the control signal to establish the timing intervals of said means for taking amplitude samples and for establishing the selected intervals for said first and second means for aliasing; and
   means for outputting at least one of the aliased first and second filtered signals as the recovered carrier signal.

9. A phase shift keyed carrier recovery loop as set forth in claim 8 wherein said means for aliasing the first filtered signal includes means for storing the aliased signal, and said means for aliasing the second filtered signal includes means for storing the aliased signal.

10. A phase shift keyed carrier recovery loop as set forth in claim 8 wherein said means for aliasing the first filtered signal and said means for aliasing the second filtered signal each has a frequency response of (sine X)/X with signal null crossing points at multiples of the selected intervals.

11. A phase shift keyed carrier recovery loop as set forth in claim 8 wherein said means responsive to the control signal includes a voltage controlled oscillator generating a frequency in response to the control signal to establish the timing intervals of said means for taking amplitude samples.

12. A phase shift keyed carrier recovery loop as set forth in claim 11 wherein said means responsive to the control signal further includes a frequency divider connected to the output of the voltage controlled oscillator for establishing the selected interval to the means for aliasing the first filtered signal and said means for aliasing the second filtered signal.

13. A phase shift keyed carrier recovery loop comprising in combination:
   a tapped delay line for taking amplitude samples of an input signal at a clocking frequency along quadrature displaced first and second channels,
   means for summing the samples of one channel into a first filtered signal,
   means for summing the samples of the second channel into a second filtered signal,
   means for sampling and storing the first filtered signal at selected intervals,
   means for sampling and storing the second filtered signal at selected intervals,
   means for multiplying a stored sample of the first filtered signal with a stored sample of the second filtered signal to generate a control voltage,
   means responsive to the control voltage for generating sample intervals to said first and second means for sampling and for generating the center frequency of the input signal to said tapped delay line to establish a clocking frequency; and
   means for outputting the stored sample of one of the first and second filtered signals as the recovered carrier signal.

14. A phase shift keyed carrier recovery loop as set forth in claim 13 including means for shaping the first filtered signal at the input of said means for multiplying.

15. A phase shift keyed carrier recovery loop as set forth in claim 14 wherein said means for generating includes a voltage controlled oscillator responsive to the control voltage for generating a clocking frequency at a multiple of the center frequency of the input signal.

16. A phase shift keyed carrier recovery loop as set forth in claim 15 wherein said means for generating further includes a frequency divider connected to the output of the voltage controlled oscillator and generating the selected intervals to the first and second means for sampling and storing.

17. A phase shift keyed carrier recovery loop, comprising in combination:
   means for taking amplitude samples of an input signal at timing intervals so as to generate quadrature displaced first and second channels,
   means for combining the samples of one channel into a first filtered signal,
   means for combining the samples of the second channel into a second filtered signal,
   first means for sampling and storing the first filtered signal at a submultiple of the center frequency of the input signal,
   second means for sampling and storing the second filtered signal at submultiples of the center frequency of the input signal,
   third means for sampling and storing connected to the output of said first means for sampling and storing for generating a first multiplier signal at selected intervals,
   fourth means for sampling and storing connected to the output of said second means for sampling and storing for generating a second multiplier signal at selected intervals,
   means for multiplying a stored sample from the third means for sampling with a stored sample from the fourth means for sampling to generate a control signal, means responsive to the control signal to establish the submultiples of the center frequency to said first and second means for sampling and storing; and means for outputting one of said first and second multiplier signals as the recovered carrier signal.

18. A phase shift keyed carrier recovery loop as set forth in claim 17 wherein said means responsive to the control signal further includes means for generating a frequency for clocking an input signal at timing intervals through said means for taking amplitude samples.

19. A phase shift keyed carrier recovery loop as set forth in claim 17 wherein said third and fourth means for sampling and storing are operated at intervals generated by a bit timing loop.

* * * * *